United States Patent
You et al.

(10) Patent No.: US 11,723,267 B2
(45) Date of Patent: Aug. 8, 2023

(54) LIGHT EMITTING DEVICE AND DISPLAYING DEVICE

(71) Applicant: BOE Technology Group Co., Ltd., Beijing (CN)

(72) Inventors: Juanjuan You, Beijing (CN); Linlin Wang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 253 days.

(21) Appl. No.: 17/188,004

(22) Filed: Mar. 1, 2021

(65) Prior Publication Data
US 2022/0029100 A1 Jan. 27, 2022

(30) Foreign Application Priority Data
Jul. 22, 2020 (CN) .......................... 202010712641.5

(51) Int. Cl.
| | |
|---|---|
| *H10K 85/60* | (2023.01) |
| *H10K 50/12* | (2023.01) |
| *H10K 50/15* | (2023.01) |
| *H10K 50/17* | (2023.01) |

(52) U.S. Cl.
CPC ........... *H10K 85/631* (2023.02); *H10K 50/12* (2023.02); *H10K 85/654* (2023.02); *H10K 85/6572* (2023.02); *H10K 50/15* (2023.02); *H10K 50/171* (2023.02)

(58) Field of Classification Search
None
See application file for complete search history.

(56) References Cited

U.S. PATENT DOCUMENTS

| | | | |
|---|---|---|---|
| 2014/0042469 A1* | 2/2014 | Seo | H10K 2101/10 257/94 |
| 2014/0225968 A1* | 8/2014 | Kamatani | C07C 17/263 585/27 |
| 2018/0190925 A1* | 7/2018 | You | H10K 50/13 |

OTHER PUBLICATIONS

Lim, Hyoungcheol et al., "Enhanced Triplet-Triplet Annihilation of Blue Fluorescent Organic Light-Emitting Diodes by Generating Excitons in Trapped Charge-Free Regions", American Chemical Society, Nov. 27, 2019. <https://pubs.acs.org/doi/10.1021/acsami.9b15303> (20 pages).

* cited by examiner

*Primary Examiner* — Evren Seven
(74) *Attorney, Agent, or Firm* — WHDA, LLP

(57) ABSTRACT

A light emitting device and a displaying device. The light emitting device includes a first electrode, a second electrode, and a light emitting unit located between the first electrode and the second electrode, and the light emitting unit includes a doped electron-barrier layer, a blue-light host layer and a doped blue-light host layer that are stacked; the doped electron-barrier layer includes an electron-barrier host material and a first guest material that is doped in the electron-barrier host material; the blue-light host layer includes a first blue-light host material; the doped blue-light host layer includes a second blue-light host material and a second guest material that is doped in the second blue-light host material; and a singlet-state energy level of the first blue-light host material is higher than a singlet-state energy level of the first guest material and a singlet-state energy level of the second guest material.

20 Claims, 2 Drawing Sheets

LIGHT EMITTING DEVICE AND DISPLAYING DEVICE

CROSS REFERENCE TO RELEVANT APPLICATIONS

The present disclosure claims the priority of the Chinese patent application filed on Jul. 22nd, 2020 before the Chinese Patent Office with the application number of 202010712641.5 and the title of "LIGHT EMITTING DEVICE AND DISPLAYING DEVICE", which is incorporated herein in its entirety by reference.

TECHNICAL FIELD

The present disclosure relates to the technical field of displaying, and particularly relates to a light emitting device and a displaying device.

BACKGROUND

In recent years, Organic Light Emitting Devices (OLED) have exhibited unique advantages in the fields of flat panel display and solid-state-light-source illumination, and thus have been paid great attention.

Traditional fluorescent blue-light emitting devices have the advantages such as a long life, a small attenuation, and the easiness in the obtaining of dark blue light with a narrow spectrum (a high color purity), so currently traditional fluorescent blue-light emitting devices are still the main products of mass production.

SUMMARY

The embodiments of the present disclosure provide a light emitting device and a displaying device.

In an aspect, there is provided a light emitting device, wherein the light emitting device comprises a first electrode, a second electrode, and a light emitting unit located between the first electrode and the second electrode, and the light emitting unit comprises a doped electron-barrier layer, a blue-light host layer and a doped blue-light host layer that are stacked;

the doped electron-barrier layer comprises an electron-barrier host material and a first guest material that is doped in the electron-barrier host material;

the blue-light host layer comprises a first blue-light host material;

the doped blue-light host layer comprises a second blue-light host material and a second guest material that is doped in the second blue-light host material; and a singlet-state energy level of the first blue-light host material is higher than a singlet-state energy level of the first guest material and a singlet-state energy level of the second guest material.

Optionally, the first electrode is an anode, the second electrode is a cathode, the doped electron-barrier layer is located between the first electrode and the blue-light host layer, and the doped blue-light host layer is located between the blue-light host layer and the second electrode.

Optionally, the first electrode is made from a transparent electrically conductive material.

Optionally, the second electrode is made from a metal.

Optionally, the first electrode is a cathode, the second electrode is an anode, the doped electron-barrier layer is located between the second electrode and the blue-light host layer, and the doped blue-light host layer is located between the blue-light host layer and the first electrode.

Optionally, the light emitting unit further comprises an electron barrier layer and an electron transporting layer;

the electron barrier layer is located between the first electrode and the doped electron-barrier layer;

the electron transporting layer is located between the second electrode and the doped blue-light host layer; and the singlet-state energy level of the first blue-light host material is lower than a singlet-state energy level of the electron barrier layer and a singlet-state energy level of the electron transporting layer.

Optionally, a material of the electron barrier layer is TAPC or TCTA.

Optionally, a material of the electron transporting layer is any one of Bphen, TPBI, BCP and B3PYMPM.

Optionally, the first guest material and the second guest material are the same, and the first blue-light host material and the second blue-light host material are the same.

Optionally, the electron-barrier host material is TAPC or TCTA, both of the first blue-light host material and the second blue-light host material are any one of PO-T2T, MADN and B3PyPPM, and both of the first guest material and the second guest material are BD or DSA-ph.

Optionally, a doping concentration of the first guest material in the doped electron-barrier layer is less than or equal to 10%.

Optionally, a thickness of the doped electron-barrier layer is in a range of 0-6 nm, and a thickness of the blue-light host layer is in a range of 1-6 nm.

Optionally, the doping concentration of the first guest material is 5%, a thickness of the doped electron-barrier layer is 3 nm, and a thickness of the blue-light host layer is 3 nm.

Optionally, the light emitting unit further comprises a hole transporting layer, and the hole transporting layer is located between the first electrode and the electron barrier layer.

Optionally, a material of the hole transporting layer is any one of NPB, TPD, m-MTDATA and SPPO13.

Optionally, the light emitting unit further comprises a hole injection layer and an electron injection layer, the hole injection layer is located between the first electrode and the hole transporting layer, and the electron injection layer is located between the second electrode and the electron transporting layer.

Optionally, a material of the hole injection layer is any one of HATCN, 2T-NATA and molybdenum trioxide.

Optionally, a material of the electron injection layer is lithium fluoride.

In another aspect, there is provided a displaying device, wherein the displaying device comprises the light emitting device stated above.

Optionally, the displaying device is a flexible displaying device or a rigid displaying device.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are merely embodiments of the present disclosure, and a person skilled in the art can obtain other figures according to these figures without paying creative work.

DETAILED DESCRIPTION

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

In the embodiments of the present disclosure, terms such as "first" and "second" are used to distinguish identical items or similar items that have substantially the same functions and effects, merely in order to clearly describe the technical solutions of the embodiments of the present disclosure, and should not be construed as indicating or implying the degrees of importance or the quantity of the specified technical features.

Currently, Triplet-Triplet Annihilation (TTA) is the main approach for increasing the efficiency of traditional fluorescent blue-light emitting devices, and its principle is that non-luminous triplet-state excitons collide to generate luminous singlet-state excitons, which increases the luminous efficiency of the devices. Therefore, the efficiency of the conversion from the triplet-state excitons to the singlet-state excitons is a key factor that influences the luminous efficiency of the devices.

Figure 1:
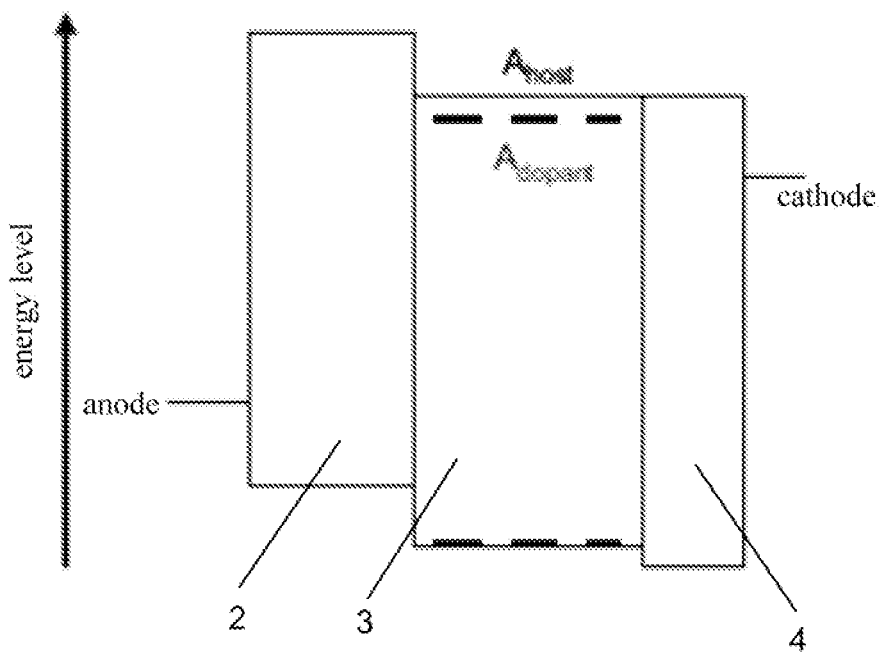
FIG. 1 is a schematic structural diagram of an OLED in the related art.

In the related art, an OLED device shown in FIG. 1 comprises an anode, an hole transporting layer (HTL) 2, a light emitting layer (EML) 3, an efficiency-enhancement layer (EEL) 4 and a cathode. In that, the EEL has a high triplet-state energy level, and can restrict the triplet-state excitons inside the EML, thereby increasing the efficiency of the TTA. However, in the device, the doping material (dopant) in the EML usually functions as a trap, whereby the triplet-state excitons are directly generated on the dopant, which reduces the efficiency of the TTA, and in turn affects the increase of the luminous efficiency of the OLED device.

Figure 2:
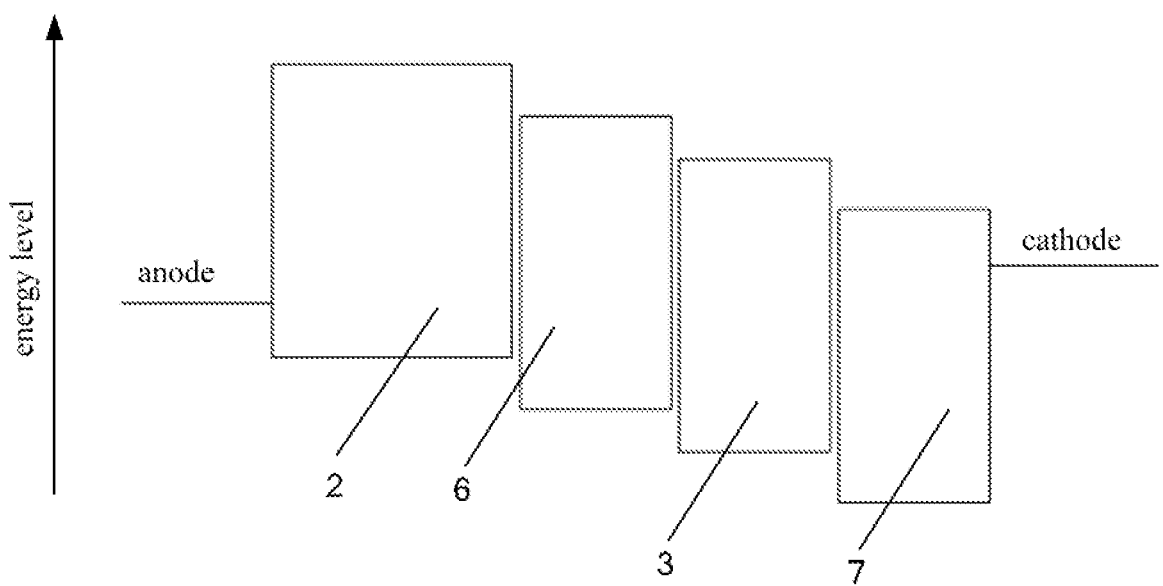
FIG. 2 is a schematic structural diagram of another OLED in the related art.

The structure shown in FIG. 2 is an improved structure from the structure shown in FIG. 1. Referring to FIG. 2, the OLED device comprises an anode, an hole transporting layer (HTL) 2, a B prime layer (also referred to as an electron barrier layer) 6, a light emitting layer (EML) 3, an electron transporting layer (ETL) 7 and a cathode, wherein the ETL may comprise an EEL, and the EML comprises a host material and a doping material.

It should be noted that, in FIGS. 1 and 2, the relative positions of the film layers are drawn according to the magnitudes of their energy levels, and they do not indicate that the actual structure has height differences therein. In practice, the film layers may be flush. In FIG. 1, $A_{host}$ represents the energy level of the host material in the EML, and $A_{dopant}$ represents the energy level of the guest material in the EML, wherein $A_{host} > A_{dopant}$.

Figure 3:
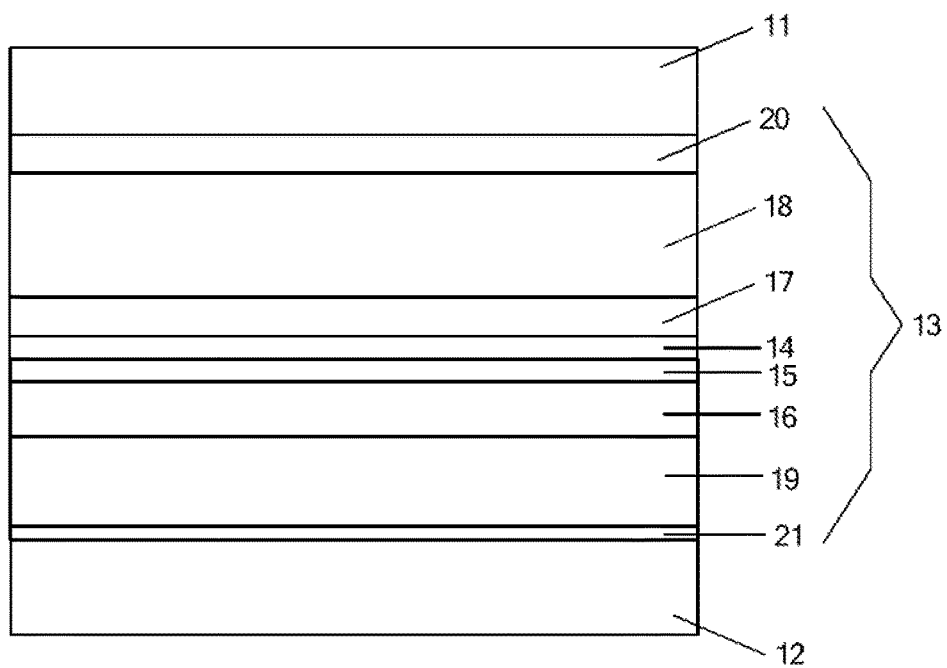
FIG. 3 is a schematic structural diagram of a light emitting device according to an embodiment of the present disclosure.

Based on the above, in order to further increase the luminous efficiency of light emitting devices, an embodiment of the present disclosure provides a light emitting device. referring to FIG. 3, the light emitting device comprises a first electrode 11, a second electrode 12, and a light emitting unit 13 located between the first electrode 11 and the second electrode 12, and the light emitting unit 13 comprises a doped electron-barrier layer 14, a blue-light host layer 15 and a doped blue-light host layer 16 that are stacked.

The doped electron-barrier layer comprises an electron-barrier host material and a first guest material that is doped in the electron-barrier host material. The blue-light host layer comprises a first blue-light host material. The doped blue-light host layer comprises a second blue-light host material and a second guest material that is doped in the second blue-light host material.

The singlet-state energy level of the first blue-light host material is higher than the singlet-state energy level of the first guest material and the singlet-state energy level of the second guest material.

The first guest material and the second guest material may be the same or different, which is not particularly limited herein. The first blue-light host material and the second blue-light host material may be the same or different, which is not particularly limited herein.

The particular materials of the electron-barrier host material, the first guest material, the second guest material, the first blue-light host material and the second blue-light host material are not limited herein, and may be selected according to actual demands.

The first electrode may be an anode, and the second electrode may be a cathode, in which case, referring to FIG. 3, the doped electron-barrier layer 14 is located between the first electrode 11 and the blue-light host layer 15, and the doped blue-light host layer 16 is located between the blue-light host layer 15 and the second electrode 12. If the first electrode is an anode, it may be made from a transparent electrically conductive material, for example, indium tin oxide (ITO). If the second electrode is a cathode, it may be made from a metal, for example, aluminum (Al), silver (Ag) and copper (Cu). Certainly, the first electrode may also be a cathode, and the second electrode may be an anode, in which case, the doped electron-barrier layer is located between the second electrode and the blue-light host layer, and the doped blue-light host layer is located between the blue-light host layer and the first electrode.

The light emitting device is mainly applied to blue-light emitting devices. If the materials used in the film layers of the light emitting unit are organic materials, the light emitting device is an organic light emitting device.

The embodiment of the present disclosure provides a light emitting device. When the light emitting device is used to emit light, the recombination between the electrons and the holes and the exciton formation mainly happen in the blue-light host layer. However, the blue-light host layer is not doped by a guest material; in other words, it does not have a trap effect. Therefore, the probability of the collision between the triplet-state excitons is greatly increased, and therefore the efficiency of Triplet-Triplet Annihilation (TTA) is also greatly increased. In other words, the efficiency with which the non-luminous triplet-state excitons collide and generate luminous singlet-state excitons is greatly increased, which increases the luminous efficiency.

Figure 4:
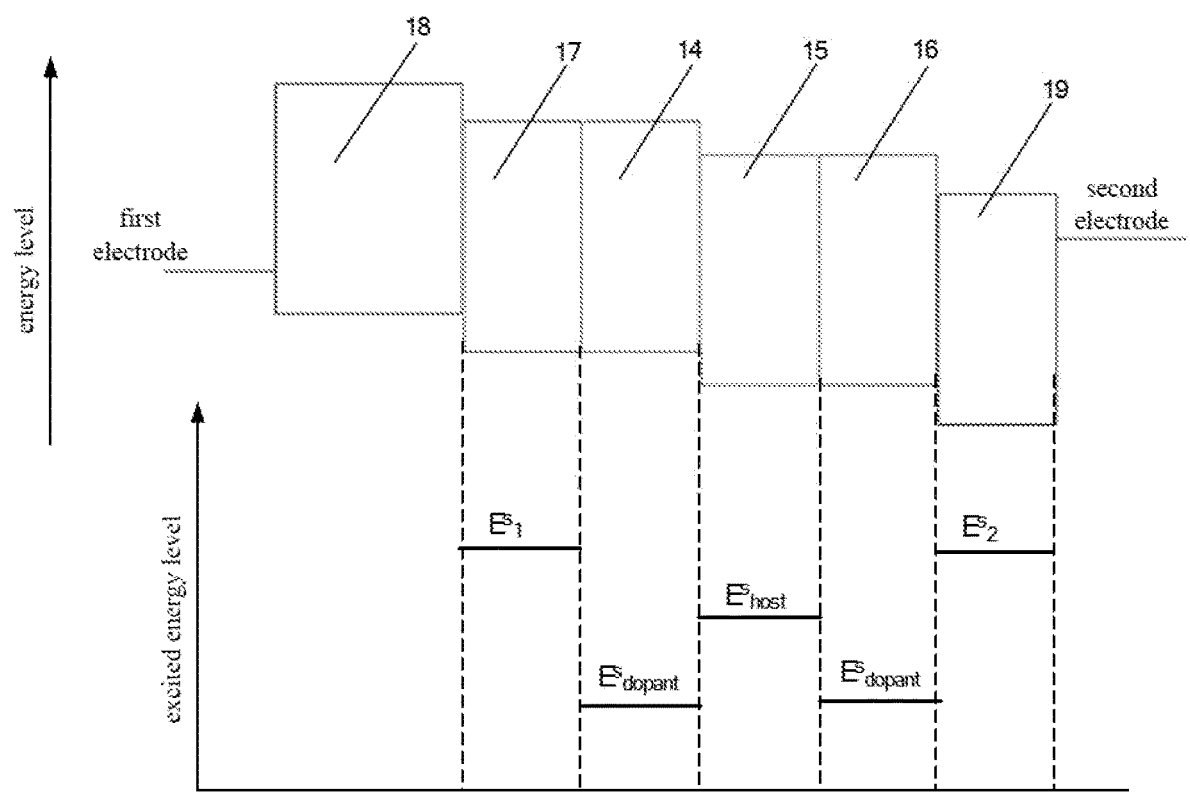
FIG. 4 is a schematic structural diagram of another light emitting device according to an embodiment of the present disclosure.

Moreover, because the doped electron-barrier layer comprises the first guest material, the doped blue-light host layer comprises the second guest material, and, referring to FIG. 4, the singlet-state energy level $E^s_{host}$ of the first blue-light host material is higher than the singlet-state energy level $E^s_{dopant}$ of the first guest material and the singlet-state energy level $E^s_{dopant}$ of the second guest material, the recombination zones in the blue-light host layer, no matter whether they are adjacent to the interface between the blue-light host layer and the doped electron-barrier layer, or adjacent to the interface between the blue-light host layer and the doped blue-light host layer, can have Forster Resonance Energy Transfer (FRET), and in turn realize luminescence. Particularly, if the recombination zones in the blue-light host layer are adjacent to the interface between the blue-light host layer and the doped electron-barrier layer, then the singlet-state excitons in the blue-light host layer transfer to the first guest material in the doped electron-barrier layer by FRET, and in turn realize luminescence. If the recombination zones in the blue-light host layer are adjacent to the interface between the blue-light host layer and the doped blue-light host layer, then the singlet-state excitons in the blue-light host layer transfer to the second guest material in the doped blue-light host layer by FRET, and in turn realize luminescence. In conclusion, the TTA efficiency of the light emitting device is greatly increased, which increases the luminous efficiency.

Optionally, in order to further increase the luminous efficiency, referring to FIG. 3, the light emitting unit further comprises an electron barrier layer (also referred to as a B prime layer) 17 and an electron transporting layer (also referred to as an ETL layer) 18, the electron barrier layer 17 is located between the first electrode 11 and the doped electron-barrier layer 14, and the electron transporting layer 18 is located between the second electrode 12 and the doped blue-light host layer 16. Referring to FIG. 4, the singlet-state energy level $E^s_{host}$ of the first blue-light host material is lower than the singlet-state energy level $E^s_1$ of the electron barrier layer and the singlet-state energy level $E^s_2$ of the electron transporting layer.

The material of the electron barrier layer may be TAPC or TCTA. TAPC is 4,4'-cyclohexylbis[N,N-bis(4-methylphenyl)aniline], whose chemical structural formula is

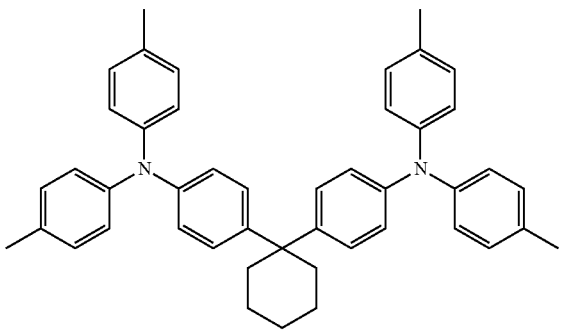

TCTA is 4,4',4"-tris(carbazol-9-yl)trianiline.

The material of the electron transporting layer may be any one of Bphen, TPBI, BCP and B3PYMPM. Bphen is phenanthroline, whose chemical structural formula is

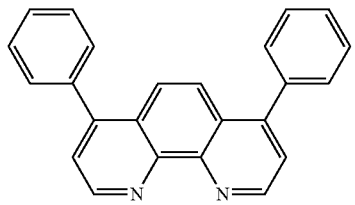

TPBI is 1,3,5-tris(1-phenyl-1H-benzimidazol-2-yl)benzene. BCP is 2,9-dimethyl-4,7-biphenyl-1,10-phenanthroline. B3PYMPM is 4,6-bis(3,5-di(pyridin-3-yl)phenyl)-2-methylpyrimidine.

The electron barrier layer can block electrons, to ensure that more electrons recombine with the holes in the blue-light host layer, thereby increasing the quantity of the excitons, and in turn increasing the luminous efficiency. The electron transporting layer facilitates the movement of the electrons to the blue-light host layer, thereby ensuring that a sufficient quantity of the electrons enter the blue-light host layer, to participate in the recombination.

The singlet-state energy level of the first blue-light host material is lower than the singlet-state energy levels of the electron barrier layer and the electron transporting layer, and the singlet-state energy level of the first blue-light host material is higher than the singlet-state energy level of the first guest material and the singlet-state energy level of the second guest material. Therefore, the singlet-state energy level of the first guest material is lower than the singlet-state energy level of the electron barrier layer, and the singlet-state energy level of the second guest material is lower than the singlet-state energy level of the electron transporting layer. Therefore, the singlet-state excitons of the first guest material cannot transfer to the electron barrier layer by FRET, and the singlet-state excitons of the second guest material cannot transfer to the electron transporting layer by FRET, which ensures that the singlet-state excitons are in the doped electron-barrier layer or the doped blue-light host layer, thereby preventing the reduction of the quantity of the singlet-state excitons, to further increase the luminous efficiency.

Optionally, in order to reduce the difficulty in fabrication and save the cost, the first guest material and the second guest material are the same, and the first blue-light host material and the second blue-light host material are the same.

Optionally, the electron-barrier host material is TAPC or TCTA, both of the first blue-light host material and the second blue-light host material are any one of PO-T2T, MADN and B3PyPPM, and both of the first guest material and the second guest material are BD or DSA-ph.

TAPC is 4,4',4"-tris(carbazol-9-yl)trianiline. TCTA is 4,4', 4"-tris(carbazol-9-yl)trianiline. PO-T2T is 2,4,6-tris[3-(diphenylphosphinyloxy)phenyl]-1,3,5-triazole, whose

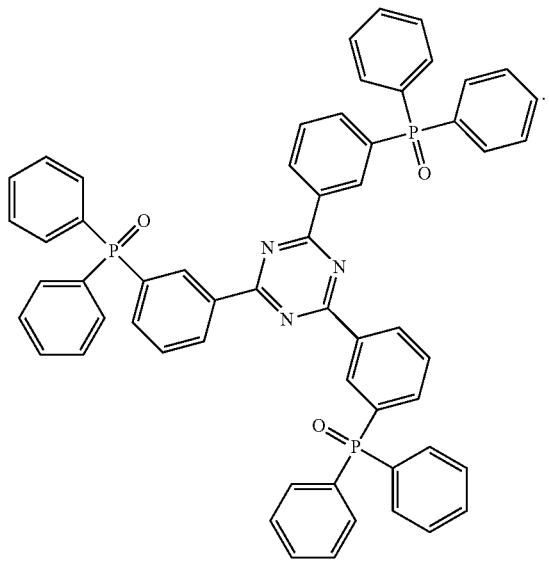 [SMILES: O=P(c1ccccc1)(c1ccccc1)c1cccc(-c2nc(-c3cccc(P(=O)(c4ccccc4)c4ccccc4)c3)nc(-c3cccc(P(=O)(c4ccccc4)c4ccccc4)c3)n2)c1]

chemical structural formula is MADN is 2-methyl-9,10-bis(naphthalen-2-yl)anthracene. B3PyPPM is 4,6-bis(3,5-di(pyridin-3-yl)phenyl)-2-phenylpyrimidine. BD is N,N'-bis(3-methylphenyl)-N,N'-bis[3-(9-phenyl-9H-fluoro-9-yl)phenyl]-pyrene-1,6-diamine, whose chemical structural formula is

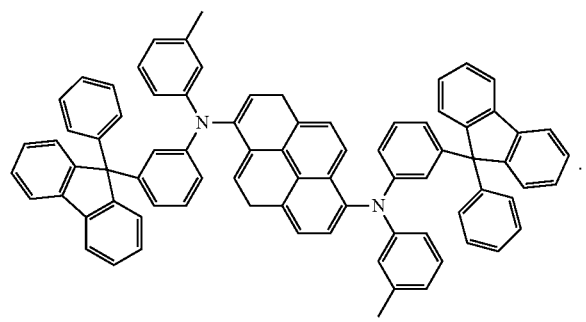 [SMILES: Cc1cccc(N(C2=CCc3ccc4c(N(c5cccc(C)c5)c5cccc(C6(c7ccccc7)c7ccccc7-c7ccccc76)c5)ccc5c4c3C2=CC5)c2cccc(C3(c4ccccc4)c4ccccc4-c4ccccc43)c2)c1]

DSA-ph is bis(diphenyl)aminostyrenylbenzene.

Optionally, the doping concentration of the first guest material in the doped electron-barrier layer is less than or equal to 10%, thereby reducing to the largest extent the affection on the electron-barrier host material, and at the same time satisfying the requirement on the increase of the luminous efficiency.

Optionally, the thickness of the doped electron-barrier layer is in the range of 0-6 nm. As an example, the thickness of the doped electron-barrier layer may be 1 nm, 3 nm, 5 nm, 6 nm and so on. Optionally, the thickness of the blue-light host layer is in the range of 1-6 nm. As an example, the thickness of the blue-light host layer may be 1 nm, 3 nm, 5 nm, 6 nm and so on.

Optionally, the doping concentration of the first guest material is 5%, the thickness of the doped electron-barrier layer is 3 nm, and the thickness of the blue-light host layer is 3 nm, thereby obtaining the light emitting device having a better performance.

Optionally, referring to FIG. 3, the light emitting unit further comprises a hole transporting layer 19, and the hole transporting layer 19 is located between the first electrode 11 and the electron barrier layer 17, which facilitates the holes to move to the blue-light host layer, thereby ensuring that a sufficient quantity of the holes enter the blue-light host layer, to participate in the recombination.

The material of the hole transporting layer may be any one of NPB, TPD, m-MTDATA and SPPO13. NPB is N,N'-diphenyl-N,N'-(1-naphthyl)-1,1'-biphenyl-4,4'-diamine, whose chemical structural formula is

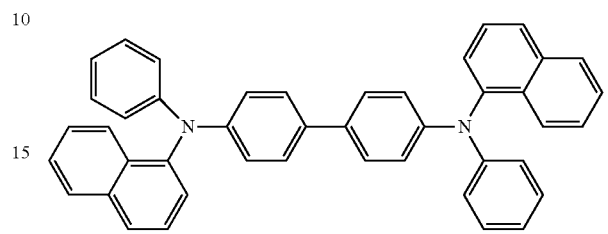

TPD is N,N-diphenyl-N,N-bis(3-methylphenyl)-1,1'-biphenyl-4,4'-diamine. m-MTDATA is 4,4',4"-tris[phenyl(m-methylphenyl)amino]trianiline. SPPO13 is spirobifluorene 2,7-bis(diphenylphosphinyl)-9,9'-spirobifluorene.

It should be noted that, in the light emitting unit, the energy-level diagrams of the film layers may refer to FIG. 4. Because the materials of the film layers are different, the corresponding energy-level diagrams are different, and here FIG. 4 is merely used as an example for the description. In FIG. 4, the energy level of the electron transporting layer 18 is higher than the energy level of the electron barrier layer 17, the energy level of the electron barrier layer 17 is equal to the energy level of the doped electron-barrier layer 14, the energy level of the doped electron-barrier layer 14 is higher than the energy level of the blue-light host layer 15, the energy level of the blue-light host layer 15 is equal to the energy level of the doped blue-light host layer 16, and the energy level of the doped blue-light host layer 16 is higher than the energy level of the hole transporting layer 19.

Optionally, referring to FIG. 3, in order to further increase the quantities of the electrons and the holes that participate in the recombination, the light emitting unit further comprises a hole injection layer 20 and an electron injection layer 21, the hole injection layer 20 is located between the first electrode 11 and the hole transporting layer 19, and the electron injection layer 21 is located between the second electrode 12 and the electron transporting layer 18.

The material of the hole injection layer may be any one of HATCN, 2T-NATA and molybdenum trioxide ($MoO_3$). The material of the electron injection layer may be lithium fluoride (LiF).

HATCN is 2,3,6,7,10,11-hexacyano-1,4,5,8,9,12-hexavabenzophenanthrene. 2T-NATA is 4,4',4"-tris[N-(naphthalen-2-yl)-N-phenyl-amino)]trianiline, whose chemical structural formula is

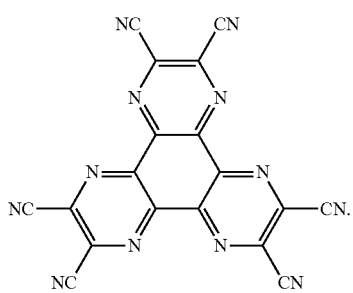 [SMILES: N#Cc1nc2c3nc(C#N)c(C#N)nc3c3nc(C#N)c(C#N)nc3c2nc1C#N]

A particular embodiment and a comparative example will be provided below, to illustrate the degree of the improvement.

The structure of the light emitting device according to an embodiment of the present disclosure is:

ITO (80 nm)/HATCN (10 nm)/NPB (110 nm)/TAPC (7 nm)/TAPC:BD (3 nm, 5%)/PO-T2T (3 nm)/PO-T2T:BD (17 nm, 5%)/Bphen (30 nm)/LiF (1 nm)/Al (100 nm).

In such a structure, the material of the first electrode (as the anode) is ITO, and the thickness is 80 nm; the material of the hole injection layer is HATCN, and the thickness is 10 nm; the material of the hole transporting layer is NPB, and the thickness is 110 nm; the material of the electron barrier layer is TAPC, and the thickness is 7 nm; the thickness of the doped electron-barrier layer is 3 nm, the electron-barrier host material is TAPC, the first guest material is BD, and the doping concentration of the first guest material is 5%; the thickness of the blue-light host layer is 3 nm, and the first blue-light host material is PO-T2T; the thickness of the doped blue-light host layer is 17 nm, the second blue-light host material is PO-T2T, the second guest material is BD, and the doping concentration of the second guest material is 5%; the material of the electron transporting layer is Bphen, and the thickness is 30 nm; the material of the electron injection layer is LiF, and the thickness is 1 nm; and the material of the second electrode (as the cathode) is Al, and the thickness is 100 nm.

The structure of the light emitting device of a comparative example is:

ITO (80 nm)/HATCN (10 nm)/NPB (110 nm)/TAPC (10 nm)/PO-T2T:BD (20 nm, 5%)/Bphen (30 nm)/LiF (1 nm)/Al (100 nm).

In the structure of the comparative example, the material of the first electrode (as the anode) is ITO, and the thickness is 80 nm; the material of the hole injection layer is HATCN, and the thickness is 10 nm; the material of the hole transporting layer is NPB, and the thickness is 110 nm; the material of the electron barrier layer is TAPC, and the thickness is 10 nm; the thickness of the light emitting layer is 20 nm, and, in the light emitting layer, the host material is PO-T2T, the guest material is BD, and the doping concentration of the guest material is 5%; the material of the electron transporting layer is Bphen, and the thickness is 30 nm; the material of the electron injection layer is LiF, and the thickness is 1 nm; and the material of the second electrode (as the cathode) is Al, and the thickness is 100 nm.

The performances of the two devices are shown in Table 1.

TABLE 1

|  | Voltage (V) | CE (cd/A) | EQE (%) | CIE (x, y) |
| --- | --- | --- | --- | --- |
| Comparative example | 3.9 | 8.5 | 7.5 | (0.13, 0.14) |
| Embodiment | 4.0 | 10 | 8.8 | (0.13, 0.14) |

In Table 1, Voltage represents the voltage, CE represents the current efficiency, EQE represents the external quantum efficiency, and CIE represents the chromaticity coordinate. It can be seen from Table 1 that, as compared with the comparative example, the percentage of the improvement of the current efficiency is (10-8.5)/8.5=17.6%, and the percentage of the improvement of the external quantum efficiency is (8.8-7.5)/7.5=17.3%, which indicates that the effect of the improvement is very significant.

An embodiment of the present disclosure provides a displaying device, wherein the displaying device comprises the light emitting device according to the above embodiments.

The displaying device may be a flexible displaying device (also referred to as a flexible screen), and may also be a rigid displaying device (i.e., a displaying device that cannot be bent), which is not limited herein. The displaying device may be an Organic Light Emitting Diode (OLED) displaying device, and may also be any products or components having a displaying function that comprise an OLED, such as a television set, a digital camera, a mobile phone and a tablet personal computer. The displaying device has the advantages such as a good displaying effect, a long life, a high stability and a high contrast.

The above are merely particular embodiments of the present disclosure, and the protection scope of the present disclosure is not limited thereto. All of the variations or substitutions that a person skilled in the art can easily envisage within the technical scope disclosed by the present disclosure should fall within the protection scope of the present disclosure. Therefore, the protection scope of the present disclosure should be subject to the protection scope of the claims.

The above-described device embodiments are merely illustrative, wherein the units that are described as separate components may or may not be physically separate, and the components that are displayed as units may or may not be physical units; in other words, they may be located at the same one location, and may also be distributed to a plurality of network units. Part or all of the modules may be selected according to the actual demands to realize the purposes of the solutions of the embodiments. A person skilled in the art can understand and implement the technical solutions without paying creative work.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail by referring to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A light emitting device, wherein the light emitting device comprises a first electrode, a second electrode, and a light emitting unit located between the first electrode and the second electrode, and the light emitting unit comprises a doped electron-barrier layer, a blue-light host layer and a doped blue-light host layer that are stacked;
the doped electron-barrier layer comprises an electron-barrier host material and a first guest material that is doped in the electron-barrier host material;
the blue-light host layer comprises a first blue-light host material;
the doped blue-light host layer comprises a second blue-light host material and a second guest material that is doped in the second blue-light host material; and
a singlet-state energy level of the first blue-light host material is higher than a singlet-state energy level of the first guest material and a singlet-state energy level of the second guest material.

2. The light emitting device according to claim 1, wherein the first electrode is an anode, the second electrode is a cathode, the doped electron-barrier layer is located between the first electrode and the blue-light host layer, and the doped blue-light host layer is located between the blue-light host layer and the second electrode.

3. The light emitting device according to claim 2, wherein the first electrode is made from a transparent electrically conductive material.

4. The light emitting device according to claim 2, wherein the second electrode is made from a metal.

5. The light emitting device according to claim 1, wherein the first electrode is a cathode, the second electrode is an anode, the doped electron-barrier layer is located between the second electrode and the blue-light host layer, and the doped blue-light host layer is located between the blue-light host layer and the first electrode.

6. The light emitting device according to claim 1, wherein the light emitting unit further comprises an electron barrier layer and an electron transporting layer;
the electron barrier layer is located between the first electrode and the doped electron-barrier layer;
the electron transporting layer is located between the second electrode and the doped blue-light host layer; and
the singlet-state energy level of the first blue-light host material is lower than a singlet-state energy level of the electron barrier layer and a singlet-state energy level of the electron transporting layer.

7. The light emitting device according to claim 6, wherein a material of the electron barrier layer is TAPC or TCTA.

8. The light emitting device according to claim 6, wherein a material of the electron transporting layer is any one of Bphen, TPBI, BCP and B3PYMPM.

9. The light emitting device according to claim 1, wherein the first guest material and the second guest material are the same, and the first blue-light host material and the second blue-light host material are the same.

10. The light emitting device according to claim 9, wherein the electron-barrier host material is TAPC or TCTA, both of the first blue-light host material and the second blue-light host material are any one of PO-T2T, MADN and B3PyPPM, and both of the first guest material and the second guest material are BD or DSA-ph.

11. The light emitting device according to claim 1, wherein a doping concentration of the first guest material in the doped electron-barrier layer is less than or equal to 10%.

12. The light emitting device according to claim 1, wherein a thickness of the doped electron-barrier layer is in a range of 0-6 nm, and a thickness of the blue-light host layer is in a range of 1-6 nm.

13. The light emitting device according to claim 11, wherein the doping concentration of the first guest material is 5%, a thickness of the doped electron-barrier layer is 3 nm, and a thickness of the blue-light host layer is 3 nm.

14. The light emitting device according to claim 6, wherein the light emitting unit further comprises a hole transporting layer, and the hole transporting layer is located between the first electrode and the electron barrier layer.

15. The light emitting device according to claim 12, wherein a material of the hole transporting layer is any one of NPB, TPD, m-MTDATA and SPPO13.

16. The light emitting device according to claim 14, wherein the light emitting unit further comprises a hole injection layer and an electron injection layer, the hole injection layer is located between the first electrode and the hole transporting layer, and the electron injection layer is located between the second electrode and the electron transporting layer.

17. The light emitting device according to claim 16, wherein a material of the hole injection layer is any one of HATCN, 2T-NATA and molybdenum trioxide.

18. The light emitting device according to claim 16, wherein a material of the electron injection layer is lithium fluoride.

19. A displaying device, wherein the displaying device comprises the light emitting device according to claim 1.

20. The displaying device according to claim 19, wherein the displaying device is a flexible displaying device or a rigid displaying device.

* * * * *